(12) United States Patent
Kotrc et al.

(10) Patent No.: US 10,895,884 B2
(45) Date of Patent: Jan. 19, 2021

(54) LOW DROPOUT (LDO) VOLTAGE REGULATOR WITH SOFT-START CIRCUIT

(71) Applicant: SEMICONDUCTOR COMPONENTS INDUSTRIES, LLC, Phoenix, AZ (US)

(72) Inventors: Vaclav Kotrc, Roznov pod Radhostem (CZ); Jan Jezik, Bystricka (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/113,973

(22) Filed: Aug. 27, 2018

(65) Prior Publication Data

US 2019/0146530 A1 May 16, 2019

Related U.S. Application Data

(60) Provisional application No. 62/585,996, filed on Nov. 14, 2017.

(51) Int. Cl.
| | |
|---|---|
| *G05F 1/46* | (2006.01) |
| *H03F 3/45* | (2006.01) |
| *G05F 1/575* | (2006.01) |
| *G05F 1/56* | (2006.01) |

(52) U.S. Cl.
CPC .............. *G05F 1/468* (2013.01); *G05F 1/562* (2013.01); *G05F 1/575* (2013.01); *H03F 3/4521* (2013.01)

(58) Field of Classification Search
CPC . G05F 1/468; G05F 1/56; G05F 1/562; G05F 1/575; H03F 3/4521
See application file for complete search history.

(56) References Cited

U.S. PATENT DOCUMENTS

| | | | | |
|---|---|---|---|---|
| 7,466,115 | B2 * | 12/2008 | Biagi | H03F 1/02 323/273 |
| 8,866,456 | B2 | 10/2014 | Kadanka et al. | |
| 9,893,607 | B1 * | 2/2018 | Wan | G05F 1/575 |
| 2013/0049721 | A1 * | 2/2013 | Lo | G05F 1/575 323/280 |
| 2013/0307501 | A1 * | 11/2013 | Kadanka | G05F 1/56 323/274 |
| 2014/0266100 | A1 | 9/2014 | Cavallini et al. | |
| 2015/0035505 | A1 * | 2/2015 | Peluso | G05F 1/56 323/273 |
| 2015/0137781 | A1 * | 5/2015 | Qu | G05F 1/56 323/280 |

OTHER PUBLICATIONS

"10 a microBUCK® SiC402A/B Integrated Buck Regulator with Programmable LDO," Datasheet, Vishay, Oct. 2014 (Year: 2014).*

* cited by examiner

*Primary Examiner* — Kyle J Moody
*Assistant Examiner* — Jye-June Lee
(74) *Attorney, Agent, or Firm* — Brake Hughes Bellermann LLP

(57) ABSTRACT

According to an aspect, a low dropout (LDO) voltage regulator includes a differential amplifier, a pass transistor coupled to an output of the differential amplifier, where the pass transistor is configured to provide an output voltage of the LDO voltage regulator, and a soft-start circuit coupled to the differential amplifier. The soft-start circuit is configured to adjust a soft-start driving signal to control a slope of the output voltage based on the output voltage during a start-up operation of the LDO voltage regulator.

18 Claims, 10 Drawing Sheets

LOW DROPOUT (LDO) VOLTAGE REGULATOR WITH SOFT-START CIRCUIT

CROSS-REFERENCE TO RELATED APPLICATION

This application claims the benefit of and priority to U.S. Provisional Application No. 62/585,996, filed Nov. 14, 2017, entitled "LOW DROPOUT (LDO) VOLTAGE REGULATOR WITH SOFT START CIRCUIT", the content of which is hereby incorporated by reference in its entirety.

TECHNICAL FIELD

This description relates to improving operations of low dropout (LDO) voltage regulators at start-up.

BACKGROUND

During a start-up operation, the output voltage of an LDO voltage regulator may have a relatively steep voltage ramp, which may not be suitable for some applications.

SUMMARY

According to an aspect, a low dropout (LDO) voltage regulator includes a differential amplifier, a pass transistor coupled to an output of the differential amplifier, where the pass transistor is configured to provide an output voltage of the LDO voltage regulator, and a soft-start circuit coupled to the differential amplifier. The soft-start circuit is configured to adjust a soft-start driving signal to control a slope of the output voltage based on the output voltage during a start-up operation of the LDO voltage regulator.

According to some aspects, the LDO voltage regulator may include one or more of the following features (or any combination thereof). The soft-start circuit may include a clamp capacitor, and a voltage slope on the clamp capacitor is the soft-start driving signal such that the voltage slope changes at least once during the start-up operation of the LDO voltage regulator. The start-up operation may include a first phase, a second phase, and a third phase, where the soft-start driving signal has a voltage slope that is different in the second phase than at least one of the first phase or the third phase. At least one of the first phase, the second phase, and the third phase has a duration that is determined by a value of the output voltage. The soft-start driving signal may include a first voltage slope during the first phase, a second voltage slope during the second phase, and a third voltage slope during the third phase, where the first voltage slope is different than the second voltage slope, and the third voltage slope is different than the second voltage slope. The differential amplifier may include an N-channel metal oxide-semiconductor (NMOS) amplifier, and the pass transistor may include a P-channel transistor. The differential amplifier may include a P-channel metal oxide-semiconductor (PMOS) amplifier, and the pass transistor may include an N-channel transistor. The differential amplifier may include a first input configured to receive a reference voltage, and a second input configured to receive the output voltage. The LDO voltage regulator may include a driver coupled to the differential amplifier and the pass transistor.

According to an aspect, an LDO voltage regulator includes a differential amplifier, a pass transistor coupled to an output of the differential amplifier, where the pass transistor is configured to provide an output voltage of the LDO voltage regulator, and a soft-start circuit coupled to the differential amplifier. The soft-start circuit includes a clamp capacitor configured to be charged during a start-up operation of the LDO voltage regulator to control an increase of the output voltage. The soft-start circuit is configured to cause the clamp capacitor to have a first voltage slope in a first phase of the start-up operation and a second voltage slope in a second phase of the start-up operation, where the second voltage slope is different than the first voltage slope. At least one of the first phase or the second phase has a duration that is determined based on a value of the output voltage.

According to some aspects, the LDO voltage regulator may include one or more of the above and/or above features (or any combination thereof). The soft-start circuit is configured to determine a start of the first phase in response to an enable signal, and the soft-start circuit is configured to determine a start of the second phase in response to the output voltage exceeding a first voltage threshold. The soft-start circuit is configured to cause the clamp capacitor to have a third voltage slope in a third phase of the start-up operation, where the third voltage slope is different than the second voltage slope. The soft-start circuit is configured to determine a start of the third phase in response to the output voltage exceeding a second voltage threshold. The soft-start circuit may include a first current source and a second current source, where the first current source and the second current source are selectively coupled to the clamp capacitor. The differential amplifier may include a first input configured to receive a reference voltage, and a second input configured to receive the output voltage. The output voltage reaches a nominal value after the start-up operation, where the nominal value is substantially equal to or greater than the reference voltage. The LDO voltage regulator may include a driver coupled to the differential amplifier and the pass transistor.

According to an aspect, a method for operating an LDO voltage regulator includes charging a clamp capacitor of a soft-start circuit during a start-up operation of the LDO voltage regulator, where the charging includes generating a first voltage slope on the clamp capacitor during a first phase of the start-up operation, generating a second voltage slope on the clamp capacitor during a second phase of the start-up operation, where the second voltage slope is different than the first voltage slope, and generating a third voltage slope on the clamp capacitor during a third phase of the start-up operation, where the third voltage slop is different than the second voltage slope. The method includes increasing an output voltage of the LDO voltage regulator based on the first voltage slope, the second voltage slope, and the third voltage slope. In some examples, the method includes starting the second phase in response to the output voltage exceeding a first voltage threshold. In some examples, the method includes starting the third phase in response to the output voltage exceeding a second voltage threshold.

The details of one or more implementations are set forth in the accompanying drawings and the description below. Other features will be apparent from the description and drawings, and from the claims.

DETAILED DESCRIPTION

Figure 1A:
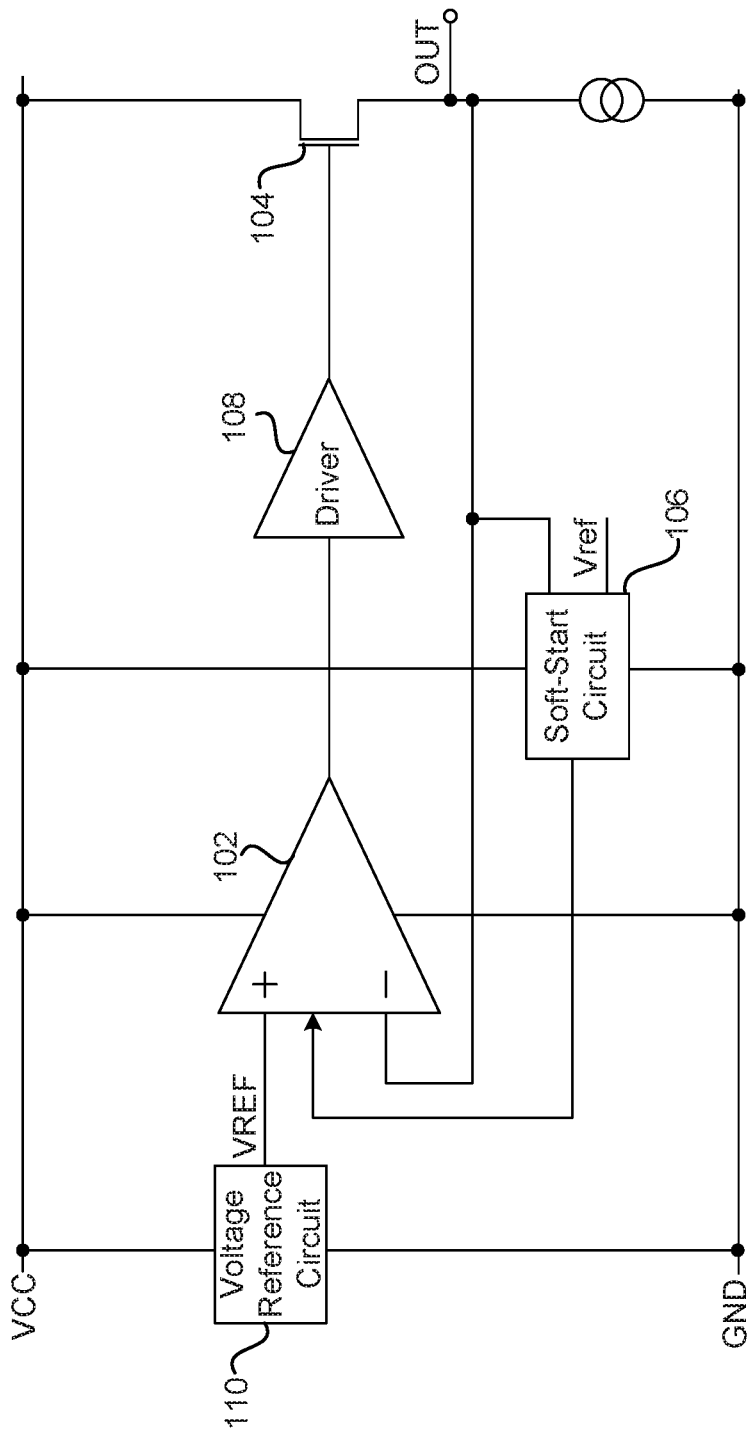
FIG. 1A illustrates a low dropout (LDO) voltage regulator according to an implementation.

The present disclosure relates to a low dropout (LDO) voltage regulator having a soft-start circuit that controls a driving slope of an output voltage of the LDO voltage regulator during a start-up operation based on the output voltage of the LDO voltage regulator. In some examples, the LDO voltage regulator may include a differential amplifier, a pass transistor coupled to the output of the differential amplifier, and the soft-start circuit. The soft-start circuit may be coupled to the differential amplifier and the output voltage of the LDO voltage regulator. Based on the output voltage, the soft-start circuit is configured to generate a soft-start driving signal to control a slope of the output voltage during the start-up operation. The soft-start circuit is configured to react to the actual output voltage and change the driving slope as needed during the course of the start-up operation. In some implementations, elements that are described as being coupled can be electrically coupled.

In some examples, the LDO voltage regulator may include an N-channel or P-channel input differential amplifier and an N-channel or P-channel pass transistor. In some examples, since an N-channel differential amplifier may not operate (or operate well) with low input voltages, an output stage clamp (e.g., a clamp capacitor that is driven by a voltage ramp) may be used. In order to achieve relatively low output voltage slope, in some conventional approaches, the clamp may be driven by a relatively slow voltage ramp (e.g., increases slowly over time). However, these conventional approaches may cause one or more side effects such as a relatively large dead time at the beginning period of the start-up operation and a relatively long settling time at the end period of the start-up operation. In some conventional approaches, a timer is used to overcome the dead time, but the timer measures (e.g., only measures) a fixed time period and may not react to the actual output voltage of the LDO voltage regulator. However, the LDO voltage regulators discussed herein may use the soft-start circuit to react accordingly to the actual output voltage and change the driving slope as needed. In addition, in some examples, the LDO voltage regulators discussed herein provide relatively low slopes of LDO output voltage at start-up. Further, in some examples, the LDO voltage regulators described herein may reduce inrush current, reduce the timing of the start-up operation (e.g., shorten a duration of the start-up operation), reduce voltage overshoots, and/or reach the desired voltage faster. Also, in some examples, the LDO voltage regulators described herein may not use a timer and/or a pre-charge circuit (e.g., a pre-charge capacitor) during the start-up operation.

In some examples, the start-up operation includes three consequencing phases. In some examples, the duration of each of the phases is dependent upon a value of the output voltage of the LDO voltage regulator. The first phase may start at or around receipt of an enable signal (e.g., when the LDO voltage regulator is activated) to a point at or around when the output voltage starts to increase. The second phase is a time period when the output voltage is rising at the defined slope (e.g., inrush current). The third phase starts when the output voltage is reaching a nominal value (e.g., a voltage reference or a voltage greater than (or less than) the voltage reference) and continues until the output voltage reaches the nominal value. In some examples, the first phase may represent a beginning time period of the start-up operation, the second phase may represent the middle time period of the start-up operation, and the third phase may represent the end time period of the start-up procedure. In some examples, during the start-up operation, the soft-start circuit may use two voltage thresholds to determine which phase the LDO voltage regulator is in, and the soft-start circuit may determine or adjust (e.g., modify) the duration of each phase to achieve a better output voltage during the start-up operation. Although some of the example implementations may be discussed in terms of a particular conductivity type transistor, the conductivity types can be switched (e.g., flipped).

Figure 1B:
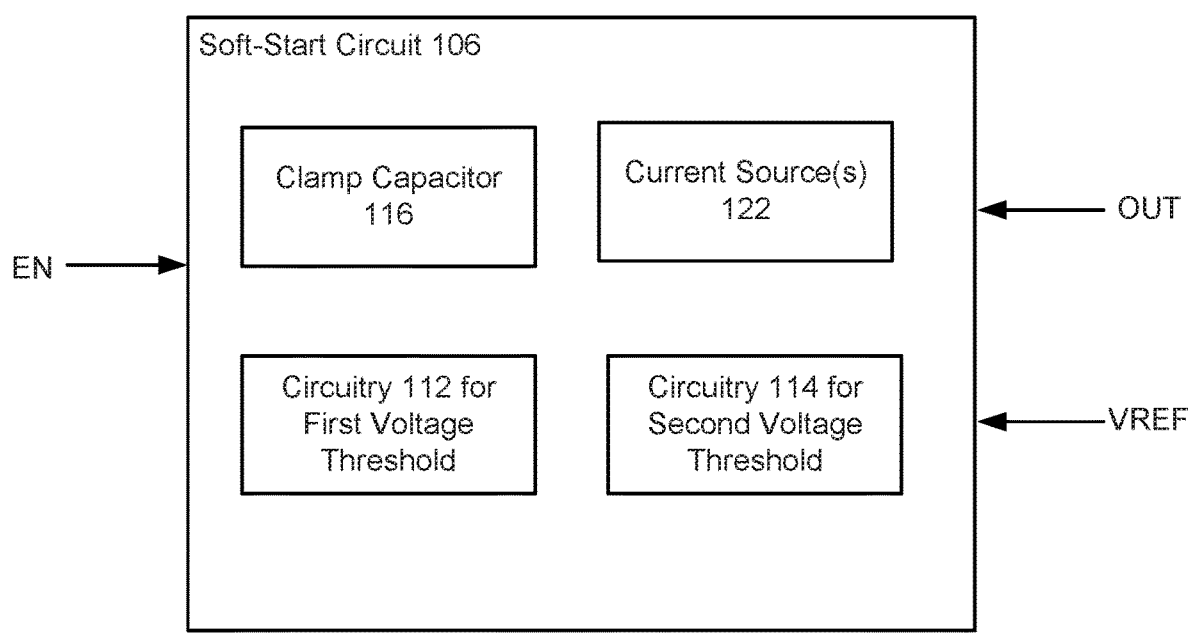
FIG. 1B illustrates a soft-start circuit of the LDO voltage regulator according to an implementation.

FIG. 1A illustrates an LDO voltage regulator 100 according to an implementation, and FIG. 1B illustrates a soft-start circuit 106 of the LDO voltage regulator 100 according to implementation. The LDO voltage regulator 100 may be a direct current (DC) linear voltage regulator that can regulate the output voltage OUT even when the supply voltage VCC is close (e.g., very close) to the output voltage OUT. The LDO voltage regulator 100 includes a differential amplifier 102, a pass transistor 104, a soft-start circuit 106, a driver 108, and a voltage reference circuit 110 that generates a voltage reference VREF.

In some examples, the differential amplifier 102 includes an N-channel metal oxide-semiconductor (NMOS) amplifier. In some examples, the differential amplifier 102 includes a P-channel metal oxide semiconductor (PMOS) amplifier. In some examples, the differential amplifier 102 includes an arrangement of two or more transistors. In some examples, the differential amplifier 102 includes a pair of N-channel transistors. In some examples, the differential amplifier 102 includes a pair of P-channel transistors. The differential amplifier 102 includes a first input configured to receive the voltage reference VREF and a second input configured to receive the output voltage OUT. The differential amplifier 102 may be connected to the supply voltage VCC and a ground potential GND. The differential amplifier 102 may amplify the difference between the voltage reference VREF and the output voltage OUT. The voltage reference circuit 110 is connected to the supply voltage VCC and the ground potential GND. The voltage reference circuit 110 is configured to generate the voltage reference VREF based on the supply voltage VCC.

The driver 108 is coupled to an output of the differential amplifier 102, and may drive the output of the differential amplifier 102 to the pass transistor 104. In some examples, the driver 108 includes one or more transistors connected between the output of the differential amplifier 102 and the pass transistor 104. The pass transistor 104 is configured to provide the output voltage OUT of the LDO voltage regulator 100. The pass transistor 104 is coupled to an output of the driver 108. In some examples, the pass transistor 104 includes a field effect transistor (FET). In some examples, the pass transistor 104 includes a metal-oxide-semiconductor field effect transistor (MOSFET). In some examples, the pass transistor 104 includes a P-channel MOSFET. In some examples, the pass transistor 104 includes an N-channel MOSFET.

The soft-start circuit 106 is coupled to the output voltage OUT and the differential amplifier 102. The soft-start circuit 106 may be connected to the supply voltage VCC and the ground potential GND. Also, the soft-start circuit 106 is configured to receive the voltage reference VREF generated by the voltage reference circuit 110. In addition, the soft-start circuit 106 is configured to receive an enable signal EN, where the transition of the enable signal EN from a first logic level to a second logic level (e.g., transition from logic low to logic high) indicates the start of the start-up operation. The start-up operation may have a duration that starts from a receipt of the enable signal EN until a time around (or after) the output voltage OUT reaches (e.g., is equal to) a nominal value. In some examples, the nominal value is the voltage reference VREF. In some examples, the nominal value of the output voltage OUT is greater than the voltage reference VREF. In some examples, the nominal value of the output voltage OUT is less than the voltage reference VREF. Based on the output voltage OUT and the voltage reference VREF, the soft-start circuit 106 is configured to generate a soft-start driving signal to control a slope of the output voltage OUT during the start-up operation. In some examples, the slope is the rate of change of the output voltage OUT during the start-up operation. In some examples, the slope is a measure of an amount of change of the output voltage OUT over a period of time of the start-up operation. In some examples, the output voltage OUT increases to the nominal value, and the rate at which the output voltage OUT increases is controlled by the soft-start circuit 106 during the start-up operation. The soft-start circuit 106 is configured to react to the actual output voltage OUT and change the slope of the output voltage OUT as needed during the course of the start-up procedure.

As shown in FIG. 1B, the soft-start circuit 106 may include a clamp capacitor 116, one or more current sources 122 that charge the clamp capacitor 116 during the start-up operation, circuitry 112 for defining a first voltage threshold, and circuitry 114 for defining a second voltage threshold. The voltage slope on the clamp capacitor 116 may drive the output voltage OUT (e.g., increase the output voltage OUT to the reference voltage VREF). The voltage slope on the clamp capacitor 116 may be the rate of voltage change on the clamp capacitor 116, which is driven according to one or more of the current sources 122. In some examples, the voltage slope is the rate of change of the voltage on the clamp capacitor 116 over time. In some examples, the voltage slope is a measure of the steepness of the voltage over time (e.g., how much the voltage increases over time). In some examples, the voltage slope on the clamp capacitor 116 is the soft-start driving signal that increases the output voltage OUT during the start-up operation. In some examples, the voltage slope on the clamp capacitor 116 changes at least once during the start-up operation of the LDO voltage regulator. In some examples, the timing of when the voltage slope changes is dependent upon a value of the output voltage OUT. In some examples, the start-up operation includes a first phase, a second phase, and a third phase, where the voltage slope in the second phase is different than at least one of the first phase or the third phase. In some examples, the first phase, the second phase, and the third phase are distinct and separate time periods of the start-up operation.

In some examples, the soft-start circuit 106 is configured to cause the clamp capacitor 116 to have a first voltage slope in the first phase of the start-up operation, and a second voltage slope in the second phase of the start-up operation. In some examples, the first voltage slope is an increase of the voltage on the clamp capacitor 116 during the first phase. In some examples, the first voltage slope is a linear increase of voltage on the clamp capacitor 116 during the first phase. In some examples, the first voltage slope includes one or more portions having a non-linear increase of voltage on the clamp capacitor 116 during the first phase. In some examples, a single current source 122 is configured to drive the first voltage slope on the clamp capacitor 116 during the first phase. In some examples, multiple current sources 122 re configured to drive the first voltage slope on the clamp capacitor 116 during the first phase.

In some examples, the second voltage slope is an increase of voltage on the clamp capacitor 116 during the second phase. In some examples, the second voltage slope is a linear increase of voltage on the clamp capacitor 116 during the second phase. In some examples, the second voltage slope includes one or more portions having a non-linear increase of voltage on the clamp capacitor 116 during the second phase. In some examples, the second voltage slope is different than the first voltage slope. In some examples, the second voltage slope is less than the first voltage slope (e.g., the rate of voltage increase in the second phase is lower than the rate of voltage increase in the first phase). For example, the second voltage slope may have a steepness that is less than a steepness of the first voltage slope. In some examples, a single current source 122 is configured to drive the second voltage slope on the clamp capacitor 116 during the second phase. In some examples, multiple current sources 122 are configured to drive the second voltage slope on the clamp capacitor 116. In some examples, two current sources 122 are configured to drive the first voltage slope on the clamp capacitor 116 during the first phase, and a single current source 122 is configured to drive the second voltage slope on the clamp capacitor 116 during the second phase, where the second voltage slope is less than the first voltage slope.

Also, at least one of the first phase or the second phase has a duration that is determined based on the value of the output voltage OUT. In some examples, the duration of each of the first phase and the second phase is dependent upon the value of the output voltage OUT. For example, the soft-start circuit is configured to determine the start of the first phase in response to the enable signal EN (e.g., the transition of the enable signal EN from a first logic level to a second logic level). During the first phase, the soft-start circuit 106 is configured to drive the first voltage slope on the clamp capacitor 116. The first phase continues until the output voltage OUT is equal to or exceeds the first voltage threshold, which indicates the start of the second phase. For example, the circuitry 112 may define the first voltage threshold, and in response to the output voltage OUT being equal to or exceeding the first voltage threshold, the soft-start circuit 106 may adjust (e.g., modify) the voltage slope on the clamp capacitor 116 (e.g., drive the second voltage slope on the clamp capacitor 116). In some examples, the soft-start circuit 106 may isolate (or remove) one of the current sources 122 that drive the voltage slope on the clamp capacitor 116 during the second phase. In some examples, the circuitry 112 includes a voltage comparator. In some examples, the circuitry 112 includes one or more transistors.

In some examples, the soft-start circuit 106 is configured to cause the clamp capacitor 116 to have a third voltage slope in a third phase of the start-up operation. In some examples, the third voltage slope is an increase of voltage on the clamp capacitor 116 during the third phase. In some examples, the third voltage slope is a linear increase of voltage on the clamp capacitor 116 during the third phase. In some examples, the third voltage slope includes one or more portions having a non-linear increase of voltage on the clamp capacitor 116 during the third phase. In some examples, the third voltage slope is different than the second voltage slope. In some examples, the third voltage slope is greater than the second voltage slope. In some examples, the third voltage slope is the same (or similar (e.g., substantially similar)) as the first voltage slope. In some examples, the third voltage slope is greater than the first voltage slope. In some examples, the third voltage slope is less than the first voltage slope.

As explained above, the soft-start circuit 106 is configured to drive the second voltage slope on the clamp capacitor 116 during the second phase. The second phase continues until the output voltage OUT is equal to or exceeds the second voltage threshold defined by the circuitry 114, which starts the beginning of the third phase. For example, the circuitry 114 may define the second voltage threshold, and in response to the output voltage OUT being equal to or exceeding the second voltage threshold, the soft-start circuit 106 may adjust the voltage slope on the clamp capacitor 116 (e.g., drive the third voltage slope on the clamp capacitor 116). In some examples, the soft-start circuit 106 may add one of the current sources 122 to the driving circuitry to drive the voltage slope on the clamp capacitor 116 during the third phase. In some examples, the circuitry 114 includes a voltage comparator. In some examples, the circuitry 114 includes one or more transistors. In some examples, the circuitry 114 includes one or more components separate from the component(s) of the circuitry 112. In some examples, the circuitry 114 includes one or more components that are also included within the circuitry 112.

The LDO voltage regulator 100 with the soft-start circuit 106 discussed herein may provide relatively low slopes of the output voltage OUT at start-up. Also, in some examples, the LDO voltage regulator 100 may reduce inrush current, reduce the timing of the start-up operation (e.g., reduce an overall duration of the start-up operation), reduce voltage overshoots, and/or reach the desired voltage faster.

Figure 2:
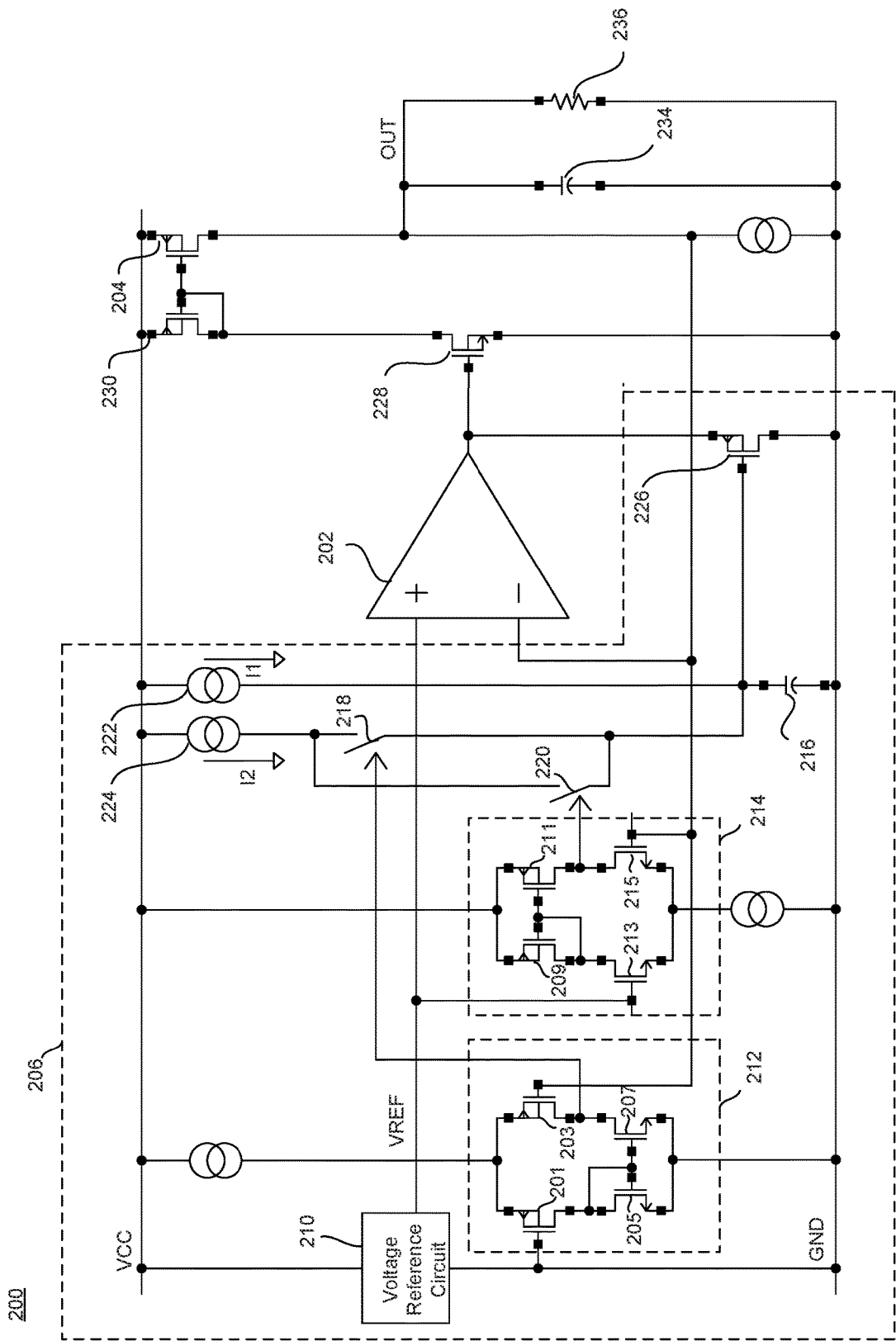
FIG. 2 illustrates an LDO voltage regulator according to another implementation.

FIG. 2 illustrates an LDO voltage regulator 200 according to an implementation. The LDO voltage regulator 200 includes a differential amplifier 202, a pass transistor 204, and a soft-start circuit 206 coupled to the differential amplifier 202. The differential amplifier 202, the pass transistor 204, and the soft-start circuit 206 may include any of the features discussed with reference to the differential amplifier 102, the pass transistor 104, and the soft-start circuit 106 of FIGS. 1A through 1B, respectively. The soft-start circuit 206 is configured to control a slope of the output voltage OUT during start-up. The differential amplifier 202 includes a first input configured to receive a voltage reference VREF generated by a voltage reference circuit 210 and a second input configured to receive the output voltage OUT. In some examples, the differential amplifier 202 includes an NMOS input error amplifier. In some examples, the pass transistor 204 includes a P-channel transistor.

The LDO voltage regulator 200 includes a transistor 228 coupled to an output of the differential amplifier 202, and a transistor 230 coupled to the transistor 228. In some examples, the transistor 228 and the transistor 230, collectively, are considered a driver (e.g., the driver 108 of FIG. 1A) configured to drive current through the pass transistor 204. The transistor 230 is coupled to the pass transistor 204, which provides the output voltage OUT to output capacitor 234 and output resistor 236. In some examples, the transistor 230 and the pass transistor 204, collectively, are considered a current mirror.

The soft-start circuit 206 includes a first voltage comparator 212, a second voltage comparator 214, a first current source 222, a second current source 224, a first switch 218, a second switch 220, a clamp capacitor 216, and a clamp transistor 226 coupled to the output of the differential amplifier 202. The first voltage comparator 212 may be defined by transistor 201, transistor 203, transistor 205, and transistor 207. The second voltage comparator 214 may be defined by transistor 209, transistor 211, transistor 213, and transistor 215. The first current source 222 may provide a current (I1) that is less than a current (I2) provided by the second current source 224. In some examples, the current (I1) provided by the first current source 222 is substantially less than the current (I2) provided by the second current source 224. In some examples, the soft-start circuit 206 may initiate the start-up of the LDO voltage regulator 200 (e.g., start the soft-start operations) in response to the enable signal (or enable event). The enable signal may be a signal received by the soft-start circuit 206 indicating that the LDO voltage regulator 200 has been activated (from a deactivated state).

In some examples, the start-up sequence includes three consequencing phases. The first phase is from receipt of the enable signal to when the output voltage OUT starts rising. The second phase is a time period when the output voltage OUT is rising at the desired slope (e.g., inrush current). The third phase begins at a point before reaching a nominal value (e.g., the voltage reference VREF or a voltage greater than (or less than) the voltage reference VREF) (e.g., one or more millivolts from the nominal value). In other words, the first phase may represent the beginning time period of the start-up operation, the second phase may represent the middle time period of the start-up operation, and the third phase may present the end time period of the start-up procedure. As discussed below, during the first phase and the third phase of the start-up operation, the clamp capacitor 216 is charged more rapidly (thereby reducing duration of the first and the third phase), as compared to the second phase of the start-up operation where the charging of the clamp capacitor 216 is slower in order to provide a relatively constant slope (e.g., OUT is rising at a relatively constant value) in order to reduce inrush current. In some examples, the second phase has a time duration that is longer than either the first phase and/or the third phase. The faster charging of the clamp capacitor 216 at the first phase and the third phase of the start-up operation provides the ability to reach the desired output voltage OUT faster (or shorten the duration of the overall start-up operation).

During the first phase, after receiving the enable signal, all capacitors (e.g., the clamp capacitor 216, the output capacitor 234) are discharged. Now, assuming that voltage and current references are working properly, the clamp transistor 226 is in an open state and holds the output voltage OUT relatively low (e.g., 0V or nearly 0V). The first switch 218 is closed (or activated or turned on), and the first current source 222 and the second current source 224 are charging the clamp capacitor 216 relatively quickly (where I1<<I2). In some examples, the second current I2 is greater than (e.g., substantially greater than) the first current I1. In some examples, the second current I2 is at least twice as greater than the first current I1. As the voltage of the clamp capacitor 216 increases to a certain level (e.g., the voltage of the clamp capacitor 216 having a first voltage slope), the output voltage OUT also starts to increase. In other words, the output voltage OUT may be correlated (or dependent upon) on the voltage of the clamp capacitor 216. In particular, the voltage at the gate of the clamp transistor 226 starts to increase, which causes the voltage at the source of the clamp transistor 226 to increase. When the source voltage reaches the threshold voltage of the transistor 228, the transistor 228 starts to conduct, which translates through the current mirror defined by the transistor 230 and the pass transistor 204, which then starts to charge the output capacitor 234. This may help the output voltage OUT to start increasing relatively soon after receipt of the enable signal.

The first voltage comparator 212 has an inbuilt offset defining a first voltage threshold at which the first switch 218 is switched off (e.g., disconnecting the second current source 224). For example, the first voltage comparator 212 receives the output voltage OUT, and when the output voltage OUT is equal to or above the first voltage level, the first voltage comparator 212 sends a signal to the first switch 218 to open (or turn off) the first switch 218, thereby disconnecting the second current source 224 from the clamp capacitor 216. In some examples, the output voltage OUT being equal to or exceeding the first threshold indicates an end of the first phase and/or the start of the second phase. As such, the duration of the first phase is dependent upon a value of the output voltage OUT.

During the second phase, since the first switch 218 is switched off, the charging of the clamp capacitor 216 is reduced (e.g., reduced significantly), which causes the output voltage OUT to increase steadily or gradually, thereby reducing the inrush current (I_inrush) at the pass transistor 204. For example, the inrush current may be defined by $$I_{inrush} = C_{out} * \frac{dVout}{dt}.$$

In some examples, the voltage slope of the clamp voltage during the second phase (e.g., the second voltage slope) is less than the voltage slope of the output voltage OUT during the first phase (e.g., the first voltage slope). The steepness of the ramp may be defined by the amount of the first current (I1) provided by the first voltage source 222. For example, the ramp-up of the output voltage OUT may be affected by the amount of the first current (I1) provided by the first voltage source 222.

The second voltage comparator 214 also has an inbuilt offset defining a second voltage threshold at which the second switch 220 is switched on, thereby connecting the second current source 224 to the clamp capacitor 216. For example, the second voltage comparator 214 receives the output voltage OUT, and when the output voltage OUT is above the second voltage threshold (e.g., where the second voltage threshold is higher than the first voltage threshold), the second voltage comparator 214 sends a signal to close (or activate or turn on) the second switch 220, which indicates an end of the second phase and/or the start of the third phase. During the third phase, after the second switch 220 is activated, the voltage of the clamp capacitor 216 starts to increase (e.g., increase rapidly) again, which may help the output voltage OUT to reach the nominal value (e.g., the voltage reference VREF) faster. For example, the voltage on the clamp capacitor 216 (e.g., the third voltage slope) may be driven by both the first current source 222 and the second current source 224.

Figure 3:
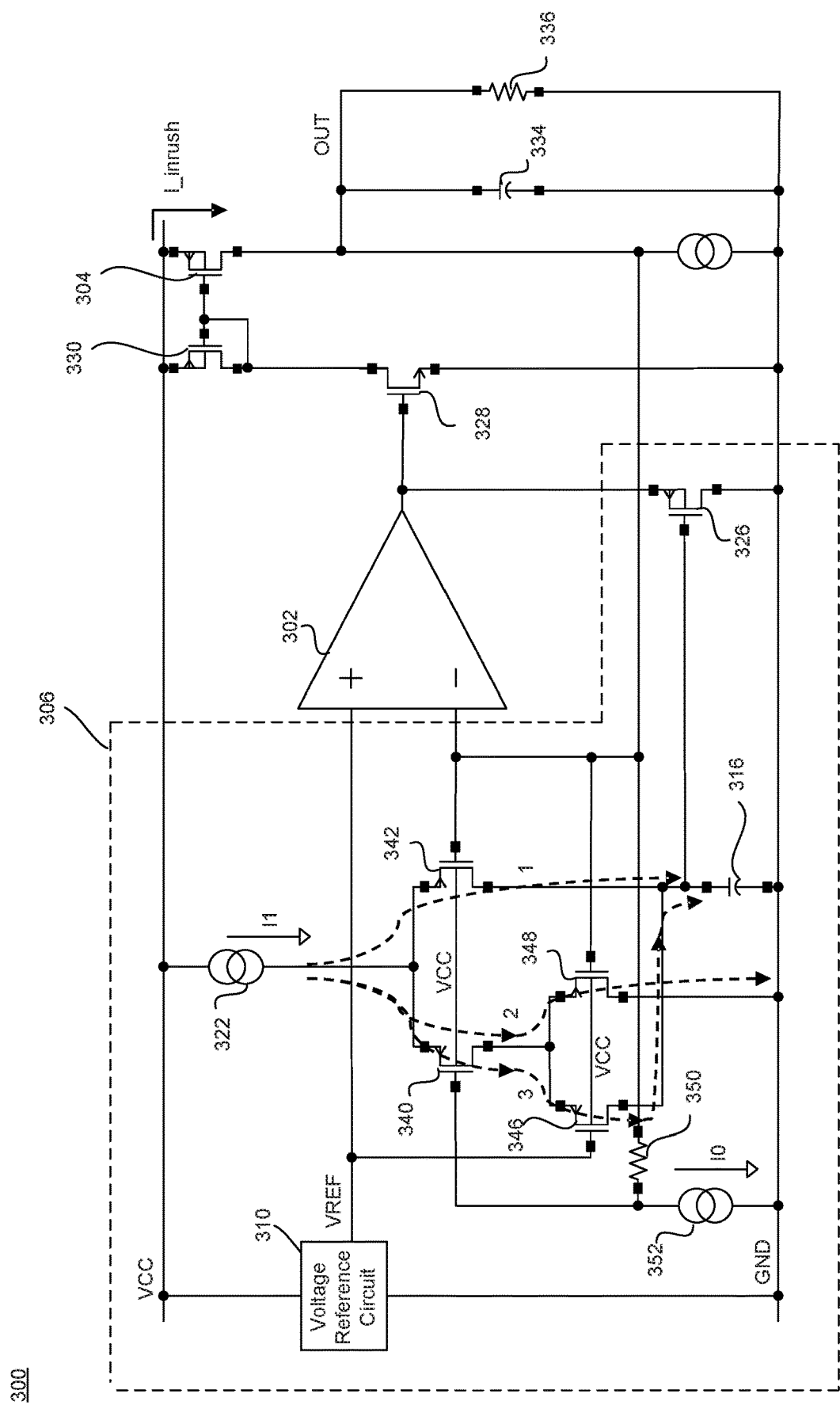
FIG. 3 illustrates an LDO voltage regulator according to another implementation.

FIG. 3 illustrates an LDO voltage regulator 300 according to another implementation. In some examples, the LDO voltage regulator 300 may provide lower consumption and potentially a smaller occupied chip area. The LDO voltage regulator 300 includes a differential amplifier 302, a pass transistor 304, and a soft-start circuit 306. The differential amplifier 302, the pass transistor 304, and the soft-start circuit 306 may include any of the features discussed with reference to the differential amplifier 102, the pass transistor 304, and the soft-start circuit 106 of FIGS. 1A through 1B, respectively, and/or the differential amplifier 202, the pass transistor 304, and the soft-start circuit 206 of FIG. 2, respectively.

The soft-start circuit 306 is coupled to the differential amplifier 302. The soft-start circuit 306 is configured to control a slope of the output voltage OUT during the start-up operation. The differential amplifier 302 includes a first input configured to receive a voltage reference VREF generated by a voltage reference circuit 310 and a second input configured to receive the output voltage OUT. The LDO voltage regulator 300 includes a transistor 328 coupled to an output of the differential amplifier 302, and a transistor 330 coupled to the transistor 328. In some examples, the transistor 328 and the transistor 330, collectively, are considered a driver (e.g., the driver 108 of FIG. 1A) configured to drive current through the pass transistor 304. The transistor 330 is coupled to the pass transistor 304, which provides the output voltage OUT to output capacitor 334 and output resistor 336. In some examples, the transistor 330 and the pass transistor 304, collectively, are considered a current mirror. The differential amplifier 302 may include an NMOS input error amplifier. The pass transistor 304 may include a P-channel transistor.

The soft-start circuit 306 includes a clamp capacitor 316, a current source 322, a current source 352, a transistor 340, a transistor 342, a transistor 346, a transistor 348, and a clamp transistor 326 coupled to the output of the differential amplifier 302. The transistor 340 and the transistor 342 define an inbuilt offset defining a first voltage threshold at which the transistor 340 is switched on (or activated) and the transistor 342 is switched off (or deactivated). The first voltage threshold defines the point at which the first phase ends and/or the second phase begins. The transistor 346 and the transistor 348 define a second voltage threshold at which the transistor 346 is switched on (or activated) and the transistor 348 is switched off (or deactivated). The second voltage threshold defines the point at which the second phase ends and/or the third phase begins.

During the first phase, after receiving the enable signal, initially, all capacitors (e.g., the clamp capacitor 316, the output capacitor 334) are discharged. Then, as the output voltage OUT is relatively low (nearly 0V), the clamp capacitor 316 starts to be charged by the current source 322 through the transistor 342 via path 1. For example, since the output voltage OUT is below the first voltage threshold, the transistor 342 is conducting, but the transistor 340 is not conducting. In this situation, the clamp capacitor 316 is charged by the current source 322 via the transistor 342 to provide the first voltage slope on the clamp capacitor 316. When the output voltage OUT increases above the first voltage threshold defined by the inbuilt offset of the transistor 340 and the transistor 342, the second phase starts, and the current provided by the current source 322 starts flowing through the transistor 340 and the transistor 348 to the ground potential GND via path 2. The gate of the transistor 346 is still connected to a higher potential than the transistor 348. This theoretically may cause the V_clamp (e.g., the voltage of the clamp capacitor 316) to stop rising, as no current charges the clamp capacitor 316.

Similar to the implementation of FIG. 2, when the output voltage OUT meets or exceeds the second voltage threshold defined by the inbuilt offset of the transistor 346 and the transistor 348), the second phase ends and the third phase starts, and the current provided by the current source 322 starts charging the clamp capacitor 316 via path 3. This may cause the voltage on the clamp capacitor 316 to start to increase according to the third voltage slope (e.g., rising rapidly again), which closes (or deactivates) the clamp transistor 326, and may help the output voltage OUT reach the nominal value (e.g., the voltage reference VREF faster or a voltage greater than (or less than) the voltage reference VREF). The current source 352 and the resistor 350 may set the proper operating point of the transistor 340. Without the current source 352 and the resistor 350, the gate of transistor 340 would be connected to ground and after the first phase, the transistor 340 would work at $V_{DS}$ nearly zero as the output voltage OUT increases.

Even if different threshold MOS transistors are used, the drain-source voltage ($V_{DS}$) of the transistor 340 will decrease as the output voltage OUT increases high enough. The voltage drop across the resistor 350 ($V_{R0}=R_0 \cdot I_0$) can set the operating point of the transistor 340 (e.g., when the transistor 340 is activated). The resistor 350 may have to be set with respect to other phases of the start-up operation. It could also be set in the way to provide some residual current through the transistor 342 to avoid leakage current discharging the clamp capacitor 316. In some examples, the LDO voltage regulator 300 may not have discrete thresholds between each soft-start phase, but rather, the current provided by the current source 322 (which is charging the clamp capacitor 316) may be changing continuously.

Figure 4:
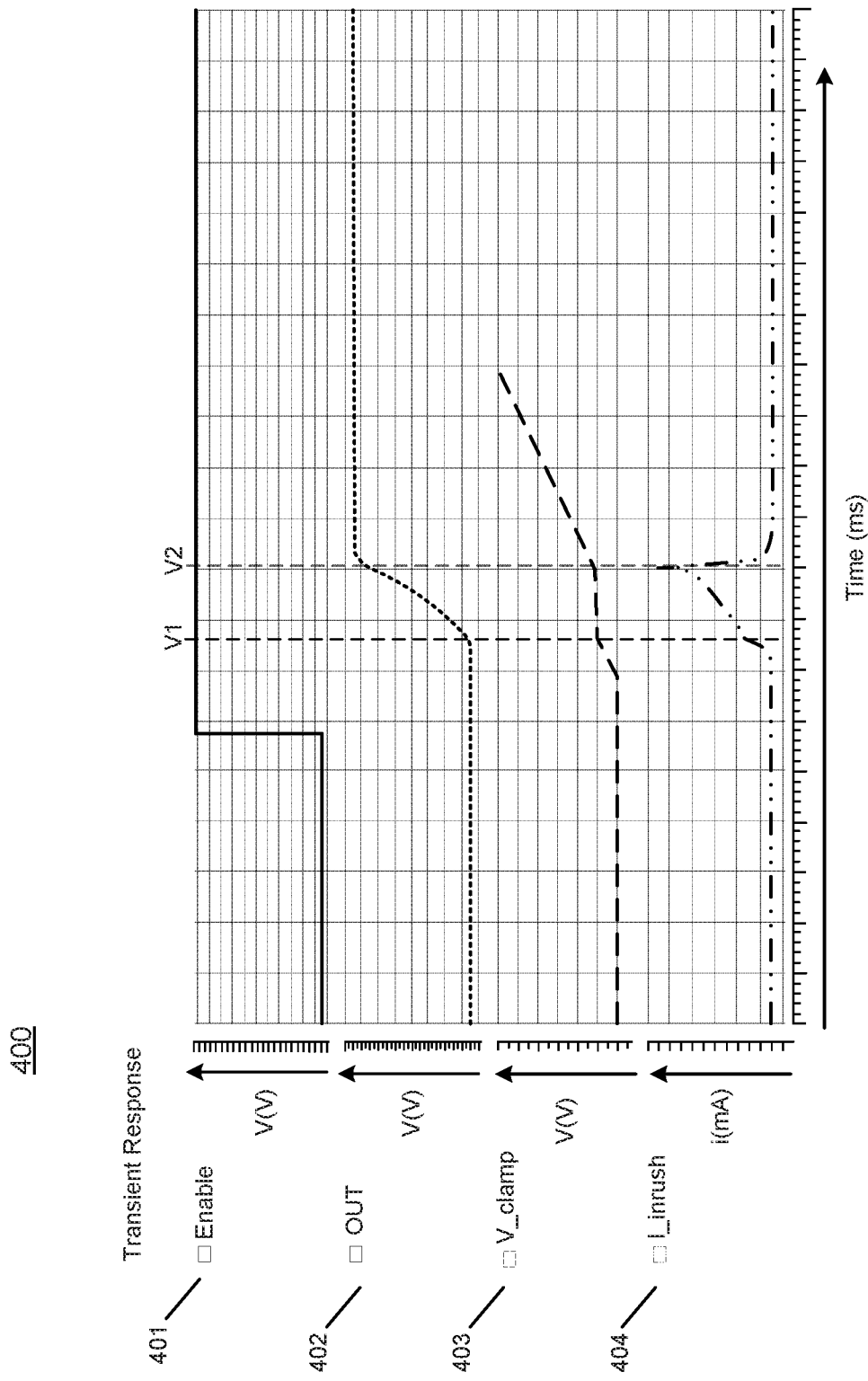
FIG. 4 illustrates a graph of transient responses of signals during start-up of an LDO voltage regulator with a soft-start circuit according to an implementation.

FIG. 4 illustrates a graph 400 of transient responses of signals during the start-up operation of an LDO voltage regulator with the soft-start circuit according to an implementation. The graph 400 includes the transient responses of an enable signal 401 (e.g., ENABLE), an output voltage 402 (e.g., OUT), a clamp capacitor voltage 403 (e.g., V_clamp), and an inrush current 404 (e.g., I_inrush). These signals may be received and/or generated by the LDO voltage regulator 100 of FIGS. 1A-1B, the LDO voltage regulator 200 of FIG. 2, or the LDO voltage regulator 300 of FIG. 3. The vertical markers V1 and V2 may represent the first voltage threshold and the second voltage threshold, respectively. The start of the first phase of the start-up operation may be indicated by a transition of the enable signal 401 from a logic low state to a logic high state. During the first phase, the clamp capacitor voltage 403 starts to increase at a first voltage slope, which then causes the output voltage 402 to start to increase. When the output voltage 402 reaches or exceeds the first voltage threshold (e.g., indicated by marker V1), the second phase of the start-up operation begins. During the second phase, the clamp capacitor voltage 403 increases at a second voltage slope, where the second voltage slope is less than the first voltage slope. During the second phase, the output voltage 402 is increasing towards the reference voltage. However, in response to the output voltage 402 reaching or exceeding the second voltage threshold (e.g., indicated by marker V2), the third phase of the start-up operation begins. During the third phase, the clamp capacitor voltage 403 increases at a third voltage slope, where the third voltage slope is greater than the second voltage slope. Also, during the third phase, the output voltage 402 has reached the nominal value (e.g., the reference voltage).

Figure 5:
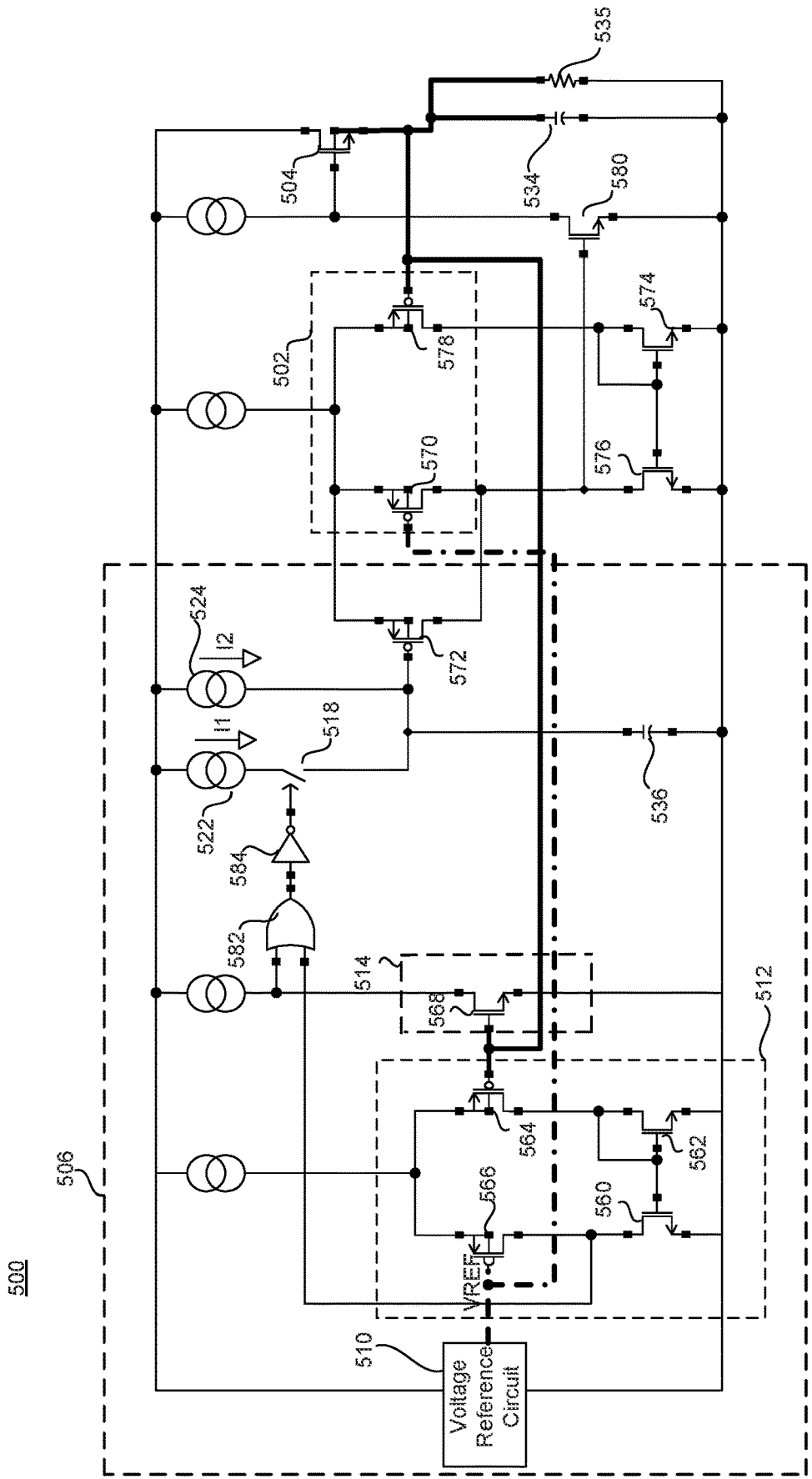
FIG. 5 illustrates an LDO voltage regulator according to another implementation.

FIG. 5 illustrates an LDO voltage regulator 500 according to an implementation. The LDO voltage regulator 500 includes a differential amplifier 502, a pass transistor 504, and a soft-start circuit 506. In some examples, the differential amplifier 502, the pass transistor 504, and the soft-start circuit 506 may include any of the features discussed with reference to FIGS. 1 through 4. The differential amplifier 502 includes a PMOS differential amplifier (e.g., a PMOS differential pair). The pass transistor 504 includes an N-channel transistor. The differential amplifier 502 includes a transistor 570 configured to receive a voltage reference VREF generated by voltage reference circuit 510, and a transistor 578 configured to receive the output voltage OUT. The transistor 570 is a P-channel transistor. The transistor 578 is a P-channel transistor. The LDO voltage regulator 500 also includes a transistor 574, a transistor 576, a transistor 580, an output capacitor 534, and an output resistor 535. In the example of FIG. 5, the soft-start circuit 506 is coupled to the input of the differential amplifier 502.

The soft-start circuit 506 includes a first voltage comparator 512, a second voltage comparator 514, a switch 518, a logic OR device 582, an inverter 584, a first current source 522, a second current source 524, a transistor 572, and a clamp capacitor 536. The first voltage comparator 512 includes a transistor 560, a transistor 562, a transistor 564, and a transistor 566. The second voltage comparator 514 includes a transistor 568.

Similar to the above-described implementations, the soft-start circuit 506 performs soft-start operations in response to an enable signal, and the process is performed according to three phases (e.g., first, second, and third). The soft-start circuit 506 is configured to provide a less steep ramp at the first and third phases, and a higher ramp at the second phase, as discussed below.

After the LDO voltage regulator 500 is enabled (e.g., in response to the enable signal) and during the first phase, the clamp capacitor 536 is charged by the second current source 524 while the first current source 522 is disconnected by the switch 518 in the open state. The output voltage OUT of the LDO voltage regulator 500 follows the voltage on the clamp capacitor 536 because of the transistor 572, which is connected in parallel with the transistor 570.

Once the output voltage OUT (as well as voltage on the clamp capacitor 536) reaches the threshold voltage of the transistor 568, the start-up operation of the LDO voltage regulator 500 enters the second phase. During the second phase, the switch 518 closes and the clamp capacitor 536 starts to be charged by both of the first current source 522 and the second current source 524. The higher charging current leads to steeper voltage ramp on the clamp capacitor 536 and the output of the LDO voltage regulator 500 during the second phase. This process continues until the output voltage OUT ramps up close to the voltage reference VREF, and the first voltage comparator 512 opens the switch 518, thereby entering the third phase of the start-up operation. Voltage difference between the output voltage OUT and the voltage reference VREF at this point is given by the inbuilt offset of the first voltage comparator 512. During the third phase, the clamp capacitor 536 is again being charged (e.g., only charged) by the second current source 524. This described sequence divides the startup process into three phases, where the beginning and end of the startup ramp have low slope to ensure smooth transition between 0V—ramp—OUT (nominal), while the middle part has higher slope.

Figure 6:
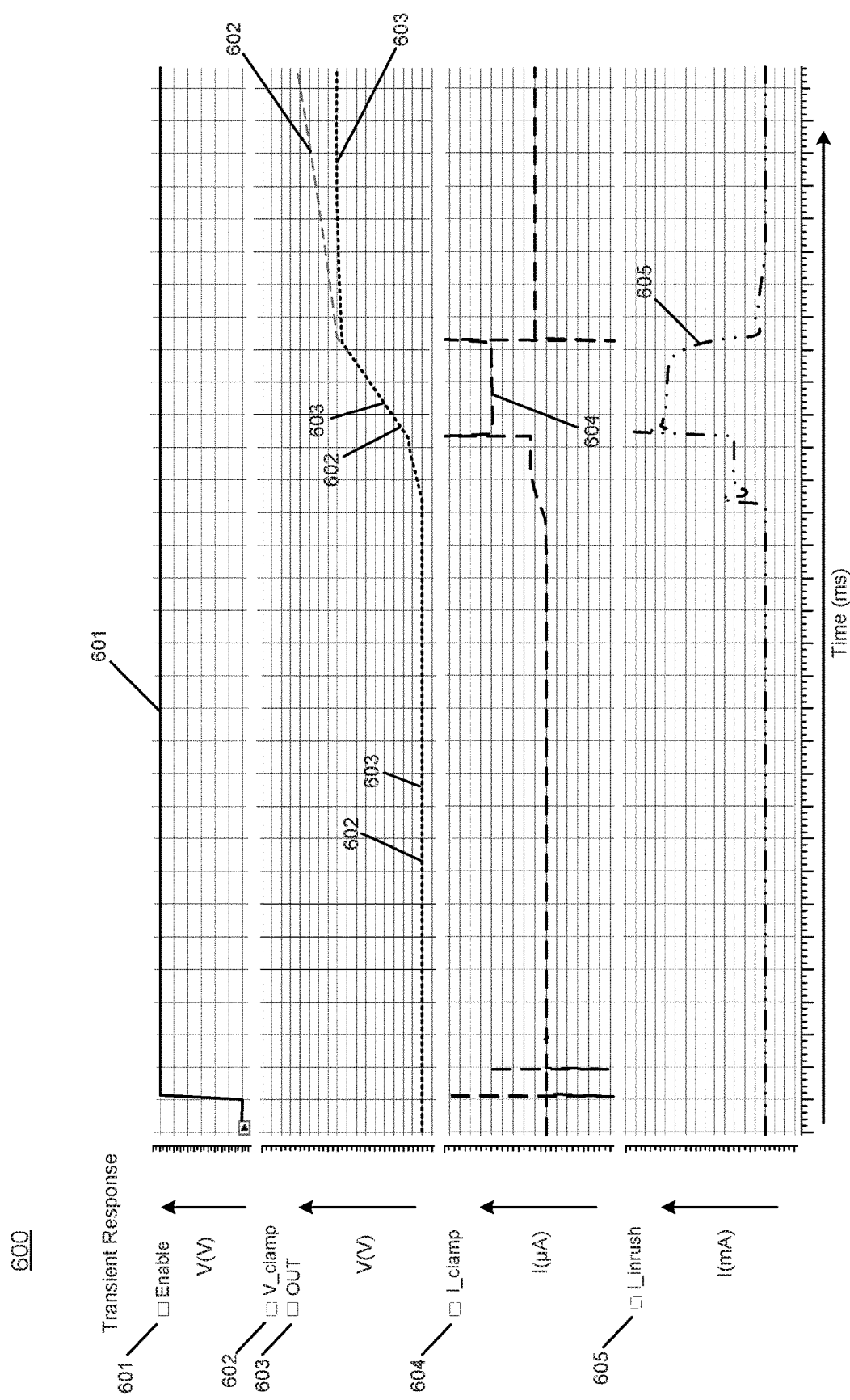
FIG. 6 illustrates a graph of transient responses of signals during a start-up operation of an LDO voltage regulator with the soft-start circuit according to another implementation.

FIG. 6 illustrates a graph 600 of transient responses of signals during the start-up operation of an LDO voltage regulator with the soft-start circuit according to an implementation. The graph 600 includes the transient responses of an enable signal 601, a clamp capacitor voltage 602, an output voltage 603, a clamp capacitor current 604, and an inrush current 605. These signals may be received and/or generated by the LDO voltage regulator 100 of FIGS. 1A-1B or the LDO voltage regulator 500 of FIG. 5.

Figure 7:
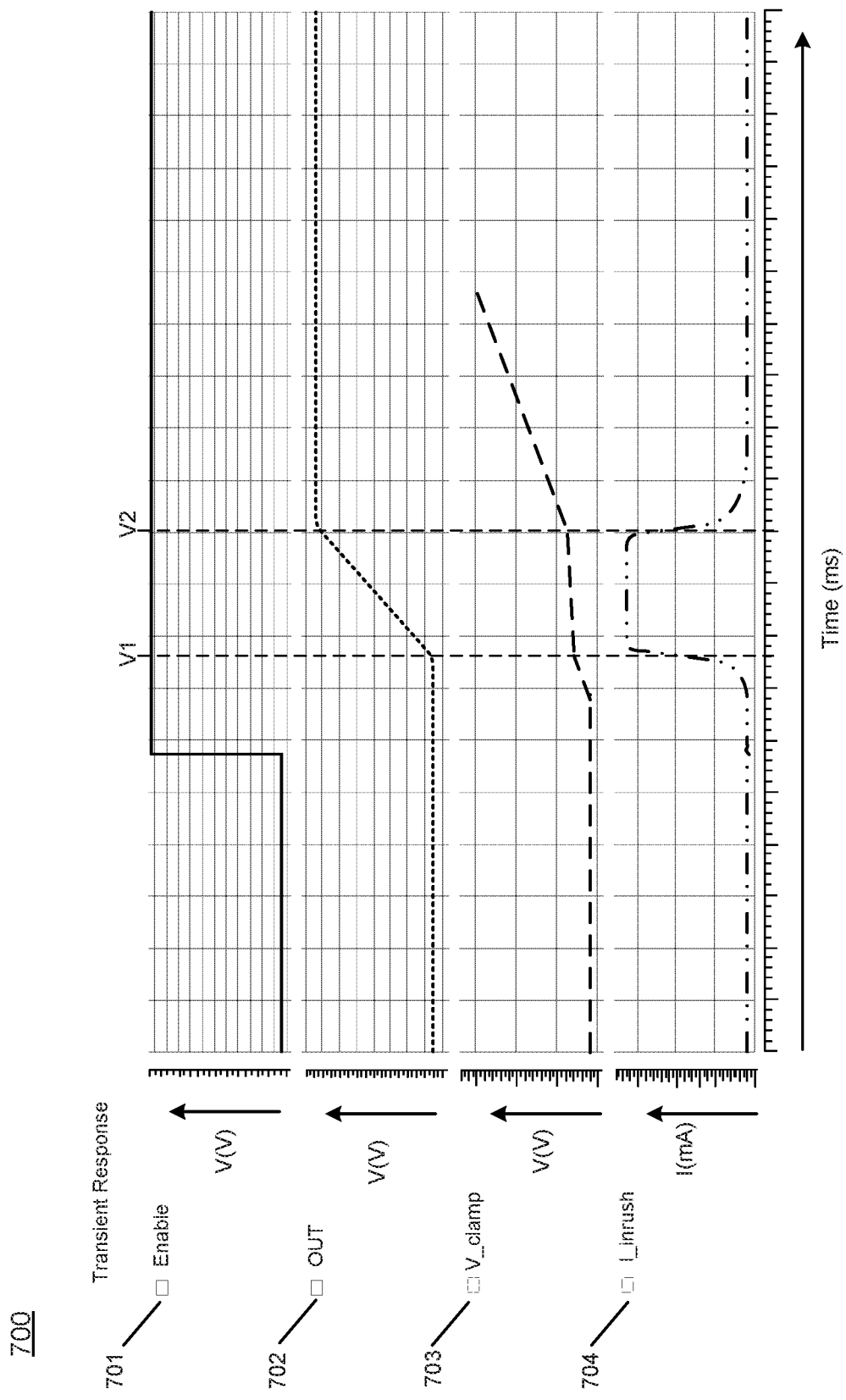
FIG. 7 illustrates a graph of transient responses of signals during a start-up operation of an LDO voltage regulator with the soft-start circuit according to another implementation.

FIG. 7 illustrates a graph 700 of transient responses of signals during the start-up operation of an LDO voltage regulator with the soft-start circuit according to an implementation. The graph 700 includes the transient responses of an enable signal 701, an output voltage 702, a clamp capacitor voltage 703, and an inrush current 704. These signals may be received and/or generated by the LDO voltage regulator 100 of FIGS. 1A-1B or the LDO voltage regulator 300 of FIG. 3. According to these implementations, the LDO voltage regulator 100/300 may be able to stop the increasing V_clamp voltage. Also, the LDO voltage regulator 100/300 provides low inrush current and low output voltage slopes.

The vertical markers V1 and V2 may represent the first voltage threshold and the second voltage threshold, respectively. The start of the first phase of the start-up operation may be indicated by a transition of the enable signal 701 from a logic low state to a logic high state. During the first phase, the clamp capacitor voltage 703 starts to increase at a first voltage slope, which then causes the output voltage 702 to start to increase. When the output voltage 702 reaches or exceeds the first voltage threshold (e.g., indicated by marker V1), the second phase of the start-up operation begins. During the second phase, the clamp capacitor voltage 703 increases at a second voltage slope, where the second voltage slope is less than the first voltage slope. During the second phase, the output voltage 702 is increasing towards the reference voltage. In response to the output voltage 702 reaching or exceeding the second voltage threshold (e.g., indicated by marker V2), the third phase of the start-up operation begins. During the third phase, the clamp capacitor voltage 703 increases at a third voltage slope, where the third voltage slope is greater than the second voltage slope. Also, during the third phase, the output voltage 402 is approaching and then reaching the nominal value (e.g., the reference voltage).

Figure 8:
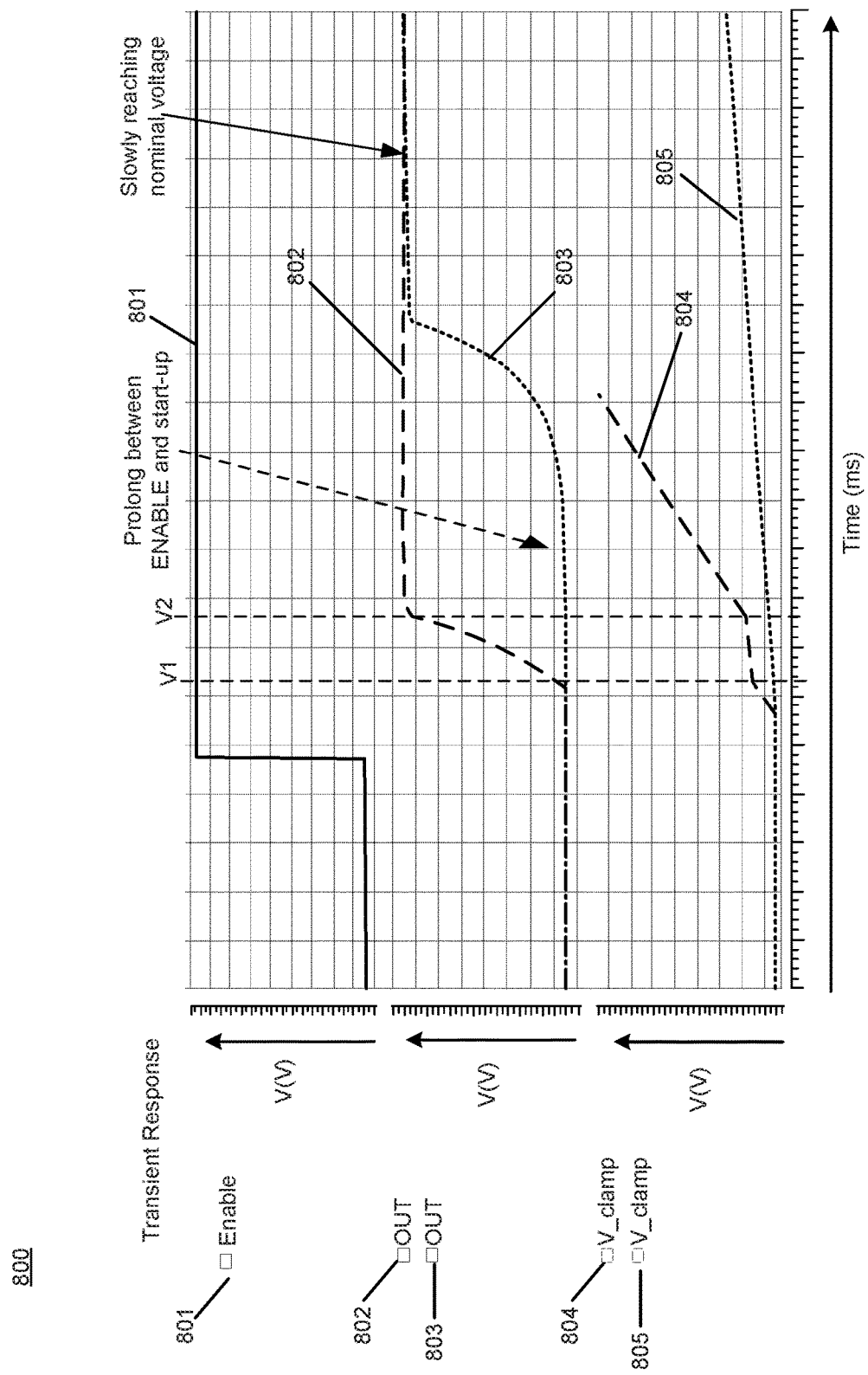
FIG. 8 illustrates a graph of transient responses of signals during a start-up operation of an LDO voltage regulator with the soft-start circuit discussed herein as compared to a conventional LDO voltage regulator according to another implementation.

FIG. 8 illustrates a graph 800 of transient responses of signals during the start-up operation of an LDO voltage regulator with the soft-start circuit discussed herein as compared to a conventional LDO voltage regulator. The graph 800 depicts an enable signal 801, an output voltage 802 of the LDO voltage regulator with the soft-start circuit discussed herein, an output voltage 803 of a conventional LDO voltage regulator, a clamp voltage 804 of the LDO voltage regulator with the soft-start circuit discussed herein, and a clamp voltage 805 of a conventional LDO voltage regulator. As shown in FIG. 8, by using the LDO voltage regulator with the soft-start circuit discussed herein, the increasing of the output voltage 802 (in response to the enable signal) is not prolonged, and the output voltage 802 can reach the nominal voltage quicker.

Figure 9:
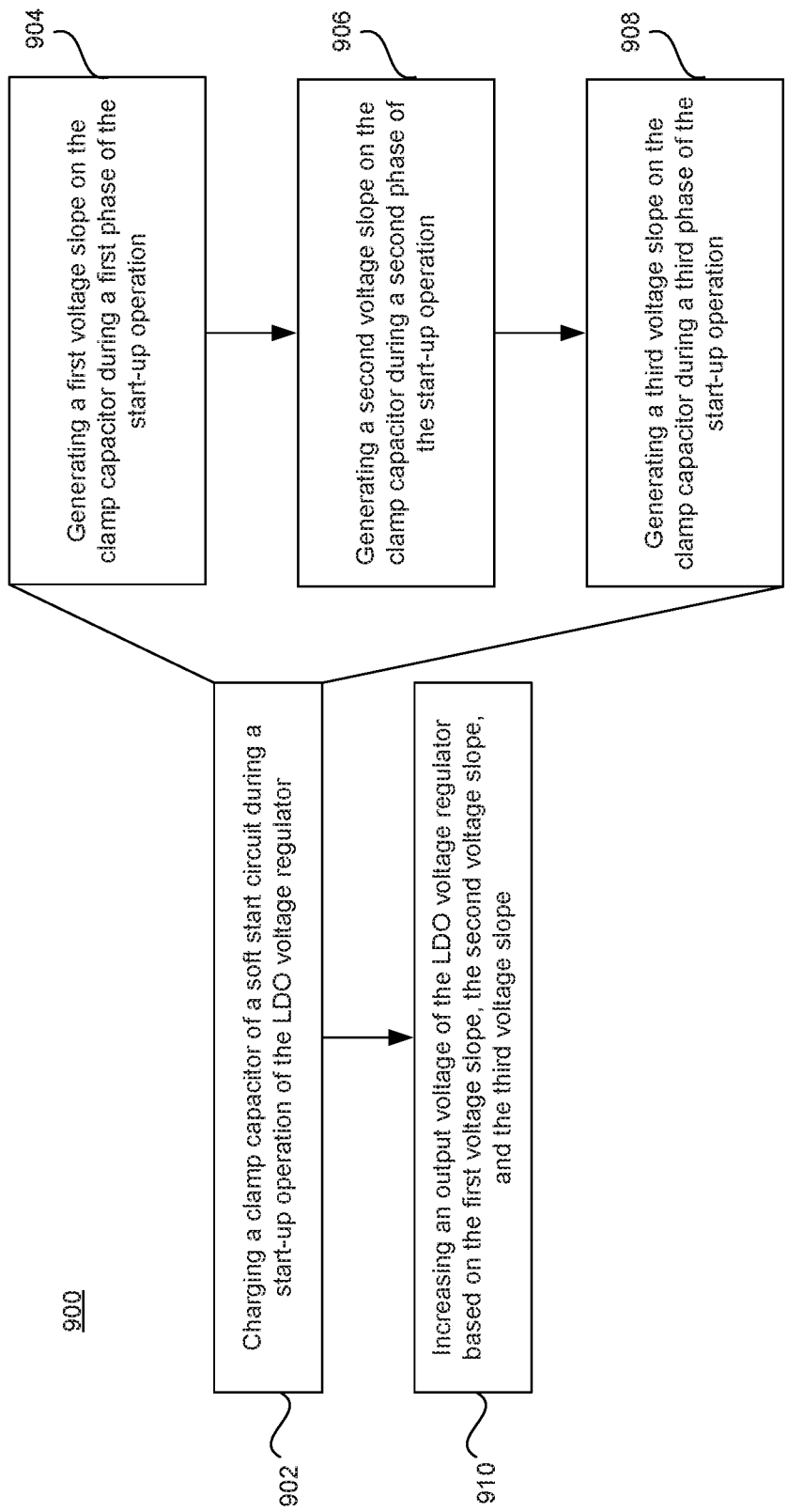
FIG. 9 illustrates a flowchart depicting example operations of an LDO voltage regulator during a start-up operation according to an implementation.

FIG. 9 depicts a flowchart 900 having example operations of an LDO regulator having a soft-start circuit according to an implementation. Although the flowchart 900 of FIG. 9 illustrates operations in sequential order, it will be appreciated that this is merely an example, and that additional or alternative operations may be included. Further, operations of FIG. 9 and related operations may be executed in a different order than that shown, or in a parallel or overlapping fashion. The example operations of the flowchart 900 may be implemented by any of the LDO voltage regulators discussed herein.

Operation 902 includes charging a clamp capacitor of a soft-start circuit during a start-up operation of the LDO voltage regulator. The charging operation may include operation 904, operation 906, and operation 908. Operation 904 includes generating a first voltage slope on the clamp capacitor during a first phase of the start-up operation. Operation 906 includes generating a second voltage slope on the clamp capacitor during a second phase of the start-up operation. In some examples, the second voltage slope is different than the first voltage slope. Operation 908 includes generating a third voltage slope on the clamp capacitor during a third phase of the start-up operation. In some examples, the third voltage slope is different than the second voltage slope. Operation 910 includes increasing an output voltage of the LDO voltage regulator based on the first voltage slope, the second voltage slope, and the third voltage slope. In some examples, the operations include starting the second phase in response to the output voltage exceeding a first voltage threshold, and starting the third phase in response to the output voltage exceeding a second voltage threshold.

The above described implementations enable the design of an LDO voltage regulator with low inrush current and low output voltage slope, which may be relatively important for some applications. In some examples, the LDO voltage regulator with the the soft-start circuit discussed herein may be implemented in image sensor power management applications. However, the LDO voltage regulator with the soft-start circuit discussed herein may be implemented in any type of power application. Also, the above described implementations may reduce the side effects that prolong overall start-up time. The implementation of the soft-start circuit discussed herein in LDO voltage regulators with PMOS input stage may reduce or eliminates the output voltage glitches at the beginning of start-up and the output voltage overshoots at its end, and the duration of each part of the startup procedure can be tuned.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A low dropout (LDO) voltage regulator comprising:
a differential amplifier;
a pass transistor coupled to an output of the differential amplifier, the pass transistor configured to provide an output voltage of the LDO voltage regulator; and
a soft-start circuit coupled to the differential amplifier, the soft-start circuit configured to adjust a soft-start driving signal to control a slope of the output voltage based on the output voltage during a start-up operation of the LDO voltage regulator,
the soft-start circuit including:
a plurality of first transistors defining a first voltage threshold;
a plurality of second transistors defining a second voltage threshold;
a clamp transistor connected to the output of the differential amplifier;
a clamp capacitor connected to the clamp transistor; and
a current source selectively connected to the clamp capacitor via a switch.

2. The LDO voltage regulator of claim 1, wherein a voltage slope on the clamp capacitor is the soft-start driving signal such that the voltage slope changes at least once during the start-up operation of the LDO voltage regulator.

3. The LDO voltage regulator of claim 1, wherein the start-up operation includes a first phase, a second phase, and a third phase, wherein the clamp capacitor is charged faster in the first phase than the second phase.

4. The LDO voltage regulator of claim 3, wherein the soft-start driving signal includes a first voltage slope during the first phase, a second voltage slope during the second phase, and a third voltage slope during the third phase, the first voltage slope being different than the second voltage slope, the third voltage slope being different than the second voltage slope.

5. The LDO voltage regulator of claim 1, wherein the clamp capacitor is connected to a gate of the clamp transistor.

6. The LDO voltage regulator of claim 1, wherein the differential amplifier includes an N-channel metal oxide-semiconductor (NMOS) amplifier, and the pass transistor includes a P-channel transistor.

7. The LDO voltage regulator of claim 1, wherein the differential amplifier includes a P-channel metal oxide-semiconductor (PMOS) amplifier, and the pass transistor includes an N-channel transistor.

8. The LDO voltage regulator of claim 1, wherein the current source of the soft-start circuit is a first current source, and the soft-start circuit includes a second current source connected to the clamp capacitor, further comprising:
a driver coupled to the differential amplifier and the pass transistor.

9. The LDO voltage regulator of claim 1, wherein the soft-start circuit is configured to adjust the slope in response to the output voltage exceeding the first voltage threshold and adjust the slope in response to the output voltage exceeding the second voltage threshold.

10. A low dropout (LDO) voltage regulator comprising:
a differential amplifier;
a pass transistor coupled to an output of the differential amplifier, the pass transistor configured to provide an output voltage of the LDO voltage regulator; and
a soft-start circuit coupled to the differential amplifier, the soft-start circuit including:
a plurality of first transistors defining a first voltage threshold;
a plurality of second transistors defining a second voltage threshold;
a clamp transistor connected to the output of the differential amplifier; and
a clamp capacitor connected to the clamp transistor, the clamp capacitor configured to be charged during a start-up operation of the LDO voltage regulator to control an increase of the output voltage,
the soft-start circuit configured to cause the clamp capacitor to have a first voltage slope in a first phase of the start-up operation and a second voltage slope in a second phase of the start-up operation, the second voltage slope being different than the first voltage slope, at least one of the first phase or the second phase having a duration that is determined based on a value of the output voltage.

11. The LDO voltage regulator of claim 10, wherein the soft-start circuit is configured to determine a start of the first phase in response to an enable signal, and the soft-start circuit is configured to determine a start of the second phase in response to the output voltage exceeding the first voltage threshold.

12. The LDO voltage regulator of claim 11, wherein the soft-start circuit is configured to cause the clamp capacitor to have a third voltage slope in a third phase of the start-up operation, the third voltage slope being different than the second voltage slope.

13. The LDO voltage regulator of claim 12, wherein the soft-start circuit is configured to determine a start of the third phase in response to the output voltage exceeding the second voltage threshold.

14. The LDO voltage regulator of claim 10, wherein the soft-start circuit includes a first current source and a second current source, the first current source being connected to the clamp capacitor, the second current source being connected to the clamp capacitor via a transistor.

15. The LDO voltage regulator of claim 10,
wherein the soft-start circuit is configured to determine a start of the first phase in response to an enable signal, determine a start of the second phase in response to the output voltage exceeding the first voltage threshold, and determine a start of a third phase in response to the output voltage exceeding the second voltage threshold.

16. The LDO voltage regulator of claim 10, wherein the output voltage reaches a nominal value after the start-up operation, the nominal value being equal to or greater than the reference voltage.

17. The LDO voltage regulator of claim 10, further comprising:
a driver coupled to the differential amplifier and the pass transistor.

18. A method for operating a low dropout (LDO) voltage regulator, the method comprising:
charging a soft-start circuit during a start-up operation of the LDO voltage regulator, the soft-start circuit including a clamp transistor connected to an output of a differential amplifier, and a clamp capacitor connected to the clamp transistor, the charging including:
generating, in response to an enable signal, a first voltage slope on the clamp capacitor during a first phase of the start-up operation;
generating, in response to the output voltage exceeding a first voltage threshold defined by a plurality of first transistors, a second voltage slope on the clamp capacitor during a second phase of the start-up operation, the second voltage slope being different than the first voltage slope;
generating, in response to the output voltage exceeding a second voltage threshold defined by a plurality of second transistors, a third voltage slope on the clamp capacitor during a third phase of the start-up operation, the third voltage slop being different than the second voltage slope; and
increasing an output voltage of the LDO voltage regulator based on the first voltage slope, the second voltage slope, and the third voltage slope.

* * * * *